United States Patent [19]

Ahmad et al.

[11] Patent Number: 5,457,400
[45] Date of Patent: Oct. 10, 1995

[54] SEMICONDUCTOR ARRAY HAVING BUILT-IN TEST CIRCUIT FOR WAFER LEVEL TESTING

[75] Inventors: Aftab Ahmad, Boise; Larren G. Weber, Caldwell; Robert S. Green, Boise, all of Id.

[73] Assignee: Micron Technology, Inc., Boise, Id.

[21] Appl. No.: 96,643

[22] Filed: Jul. 23, 1993

Related U.S. Application Data

[63] Continuation of Ser. No. 866,621, Apr. 10, 1992, abandoned.

[51] Int. Cl.$^6$ .................................................. G01R 31/28
[52] U.S. Cl. ...................... 324/763; 324/158.1; 324/765; 371/22.5
[58] Field of Search .................... 324/158 F, 158 R, 324/73.1, 763, 754, 158.1, 765; 371/22.1, 22.5, 22.6, 25.1

[56] References Cited

U.S. PATENT DOCUMENTS

| | | | |
|---|---|---|---|
| 4,079,338 | 3/1978 | Kronlage | 331/57 |
| 4,890,270 | 12/1989 | Griffith | 368/113 |
| 4,961,053 | 10/1990 | Krug | 324/158 R |
| 5,047,711 | 9/1991 | Smith et al. | 324/158 R |
| 5,083,299 | 1/1992 | Schwanke et al. | 368/113 |
| 5,099,196 | 3/1992 | Longwell et al. | 324/158 R |

FOREIGN PATENT DOCUMENTS

| | | | |
|---|---|---|---|
| 0181548 | 10/1984 | Japan | 437/8 |
| 0227081 | 9/1989 | Japan | 324/73.1 |

*Primary Examiner*—Ernest F. Karlsen
*Attorney, Agent, or Firm*—Stanley N. Protigal; Stephen A. Gratton

[57] ABSTRACT

A test circuit is provided for an integrated circuit device, whereby an oscillator is provided on-chip and is activated by a test circuit. The test circuit provides an ability to test the devices while still on the wafer and facilitates burning in the wafer prior to singulating the parts, since it is not necessary to separately establish electrical connections at contact points on the individual integrated circuit devices. The oscillator may be adjusted in speed so that further tests may be effected by changing a test speed through the test circuit. Response of the DUT at different operating speeds is determined by the adjustment of the oscillator speed so that a timing signal used for the testing may be varied.

18 Claims, 11 Drawing Sheets

SEMICONDUCTOR ARRAY HAVING BUILT-IN TEST CIRCUIT FOR WAFER LEVEL TESTING

This application is a continuation of application Ser. No. 07/866,621 filed Apr. 10, 1992, now abandoned.

FIELD OF THE INVENTION

This invention relates to electronic testing of circuits, such as integrated circuits at operational under varying environmental conditions. More particularly, it relates to the testing of the response of digital electronic devices in order to properly determine the functionality of such devices, in which the device under is at least partially contained within the devices under test. More particularly, the invention relates to recording of times of failure. The invention also relates to the testing of electronic integrated circuits while the integrated circuit devices are in wafer form prior to singulation.

BACKGROUND OF THE INVENTION

Integrated circuit memory devices, such as dynamic random access memories (DRAMs) and static random access memories (SRAMs) undergo testing by the manufacturer during production and often by the end user, for example, in a memory test conducted during computer initialization. As densities of the memory device increase, so that individual IC's are capable of storing sixteen or more megabits of information, the time necessary for testing the IC's increases as well.

To reduce the testing time required, it is known in the art to place the DRAMs in a test mode. In a normal operating mode, a DRAM reads and writes one bit at a time, with exceptions for special operating modes. In the test mode, the parts are addressed in a manner which provides a series of outputs from the full array on the part in an expeditious manner, as distinguished from the memory array parts such as normal operating mode, which is intended for rapid access of data. A DRAM could be tested in the normal operating mode, but the time required to conduct exhaustive testing is excessive.

SRAMS likewise undergo testing by the manufacturer. While operating conditions of SRAM's may make performance criteria easier to define, many of the tests which must be performed on DRAMs must also be preformed on SRAMs. The testing of SRAMs must often be performed at higher speed because of the faster response expected from these parts.

In addition, there is an increased interest in providing parts which are fully characterized prior to packaging. This is desired not only because of the cost of the package, but also because there is demand for multichip modules (MCMs), in which multiple parts in die form are tested and assembled into a single unit. While there are various techniques purposed for testing, burning in and characterizing a singulated die, it would be advantageous to be able to "wafer map" the die prior to assembly with as many performance characteristics as possible. Ideally, one would want to be able to map the wafer with full device characterization.

MCMs create a particular need for testing prior to assembly, as contrasted to the economics of testing parts which are discretely packaged as singulated parts. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Even where packaging costs are considerably higher, as in ceramic encapsulated parts, testing unpackaged die is economical for discretely packaged parts when the added costs approximates that of cost of packaging divided by yield:

$$\frac{C_{DIE} \times C_{PACKAGE}}{Yield} = C_{DIE} \times C_{ADDL.\ KGD}$$

where
C=cost
$C_{DIE}$=manufacturing cost of functional die
$C_{ADDL.\ KGD}$=additional cost of testing unpackaged die in order to produce known good die (KGD)

Note that in the case of discretely packaged parts, the cost of the die ($C_{DIE}$) is essentially not a factor. This changes in the case of MCMs:

$$(C_{DIE}) \times \frac{(number\ of\ die)}{Yield} \times C_{PACKAGE} = C_{DIE} \times C_{ADDL.\ KGD}$$

Note that again $C_{DIE}$ is not a factor in modules having identical part types; however, the equation must be modified to account for varied costs and yields of die in modules with mixed part types. With MCMs, the cost of packaging a failed part is proportional to the number of die in the module. In the case of a x16 memory array module, where probe-to-ship yield of the die is 95%, the costs are:

$$\frac{16}{0.95} \times C_{PACKAGE} = C_{ADDL.\ KGD}$$

so the additional costs of testing for known good die (KGD) may be 16 times the cost of testing after assembly of an unrepairable module in order to be economical. This, of course, is modified by the ability to repair failed modules.

One of the test procedures which is used to determine the viability of semiconductor integrated circuits is burnin. In the burnin procedure, the parts are exercised for a period of time with different temperature cycles, including at elevated temperatures. This procedure provides an indication of the operation of the device at the different operating temperatures, and also results in a determination of early part failures. During the burnin process, such early failures, known as "infant mortality," is predicted to occur within a particular amount of time. Therefore, if it can be determined that almost all such failures occur within the first 48 hours of burnin testing, then the burnin test can be completed within that time period. Such factors as temperature, process and device type influence when failures stop happening, so the specific burnin time period will vary with part type and other factors. In the case of testing of packaged discrete devices, each device is able to be separately monitored by external test equipment, so that the external test equipment can be used to provide an indication of the time of failure of that particular part. On the other hand, if testing is be achieved prior to the parts being singulated, it is necessary to either provide external equipment with an indication of the performance of each individual part or to record the failure of each individual part for later mapping.

In actual practice, it is common to matrix discrete parts on a DUT (device under test) board, so that each part is exercised simultaneously. It is nevertheless possible to obtain a general indication of failure by sensing the parts within the matrix.

Digital electronic circuits generally employ two-state output terminals to convey binary logic information. Such two-state output terminals produce one of two output voltages: a relatively high voltage, or a relatively low voltage. These two discernable voltages define two possible binary logic states. The low voltage defines a "0," "false," or "low" logic state. The high voltage defines a "1," "true," or "high" logic state. A voltage corresponding to a "low" is defined to be below a first threshold voltage and a voltage corresponding to a "high" is defined to be above a second, higher, threshold voltage. A voltage between the first and second thresholds is not a valid logic state, and is avoided (except during transitions between valid states) by the specific operational parameters of the electronic devices formed in the integrated circuit or other digital circuitry.

Output terminals of digital circuitry, and integrated circuits in particular, can be constructed to produce a third state. This additional or third state is not defined by a voltage level, but instead is indicated by a high impedance state at the signal terminal. Such a high impedance signal state is assumed during certain operations or under specified conditions. For example, in memory integrated circuits a high impedance state has been used on a data terminal to indicate failure during a testing mode of operation.

The high impedance state or "tri-state" does not usually correspond to a logic state. In some memory chips, such a high impedance state is useful where multiple data terminals are to be electrically connected to a common data bus. The memory of the associated computer control circuitry allows a single memory chip to operate while the data terminal of other chips are placed in a high impedance state. Thus, a single input terminal, with control circuitry selecting which of the output terminals is to be active at any given time. However, the high impedance signal state of a three-state signal terminal can also be used to convey information.

The ability to provide built-in test equipment for semiconductor integrated circuits permits testing to be accomplished in a simplified manner by means of a small number of conductors. In one configuration, testing can be accomplished by applying a supplemental conductive metal mask on the wafer and connecting the wafer to as few as two connections. A built in test circuit on each individual die can perform the test, and record the results of the test. The recorded results can then be read on the discrete die.

In one purposed system, an additional metal mask is applied to the completed wafer and connections to power and ground are made through the mask. After completion of the tests, the mask is stripped and the integrated circuit devices may be scanned for the results of the test. The results may be stored in a PROM arrangement, whereby a failure is indicated by a particular logic output of the PROM section.

The discussion of PROM storage of test information in the present invention is meant to describe the storage of information regarding the test, regardless of whether the format of the stored information conforms with standard PROM definitions and protocols. The purpose of the storage of the test information is simply to permit reading of the test results from the part subsequent to the test.

SUMMARY OF THE INVENTION

In accordance with the present invention, a test circuit is provided for an integrated circuit device, whereby an additional conductive layer is deposited on a semiconductor wafer onto which the semiconductor devices have been formed. The additional layer provides a conductive path to power the test circuits and allows the use of very few electrical connections in order to permit testing of the devices while still on the wafer. The ability to test the devices while still on the wafer facilitates burning in the wafer prior to singulating the parts, since it is not necessary to establish electrical connections at contact points on the individual integrated circuit devices. In one embodiment of the invention, the additional conductive layer is a metal mask and in a further aspect of that embodiment permits external connections to be accomplished at locations outside the die areas, thereby avoiding damage to the integrated circuit devices.

Subsequent to testing of the die in wafer form, the metal mask is stripped and the die are singulated. According to another aspect of the invention, the built in test circuit, without the metal mask may be caused to perform further tests by establishing further connections to the test circuit. In one aspect of the invention, further tests are effected by increasing a test speed by the test circuit. It is also possible to separately address the individual integrated circuit devices in order to read a recorded output of failure detection period.

According to a further aspect of the invention, an internal test device on an integrated circuit sequences through timed counters in order to provide an indication of the time during test at which a failure has occurred. The reading of PROM recorded information is then effected, thereby providing an indication of the failure of the part in further indication of the time of failure in order that an indication of whether the burnin cycle is sufficiently long may be obtained from the recorded information.

DETAILED DESCRIPTION OF THE PREFERRED EMBODIMENT

Figure 1:
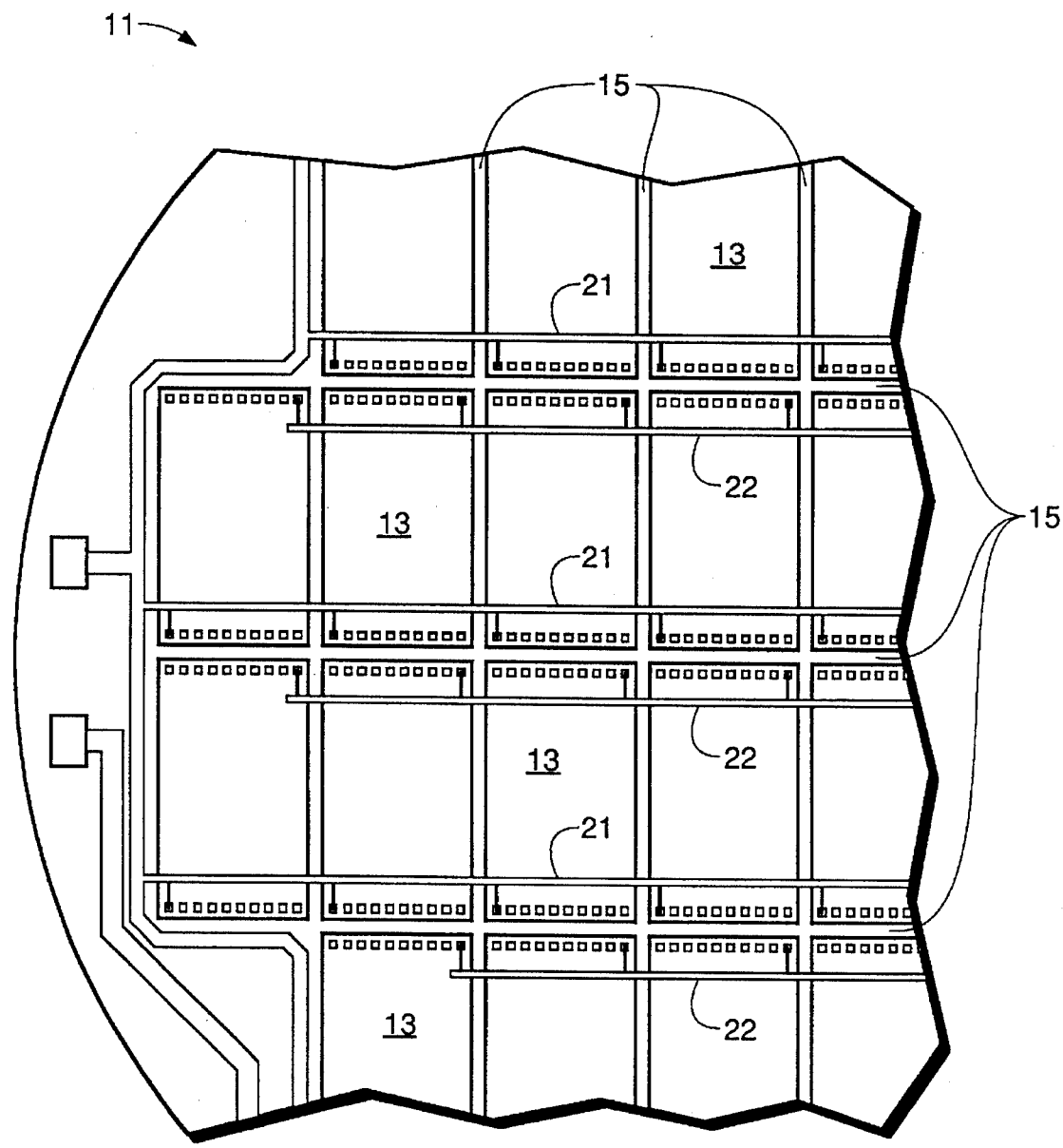
FIG. 1 shows a top view of a plurality of semiconductor integrated circuit devices on a section of a semiconductor wafer showing the incidents of on pads and "streets" separating the integrated circuit devices.

FIG. 1 shows a top view of a portion of semiconductor wafer 11, showing several semiconductor die 13. The semiconductor die, 13 are the electronic circuitry of an integrated circuit devices and are typically mounted to a lead frame or other external connection device (not shown). The die 13 are typically singulated by use of a wafer saw, which grinds the wafer 11 along the wafer cut zones 15 separating the die 13, usually referred to "streets". While the action of the wafer saw normally causes. any circuitry which extends into the streets to short to substrate, this is usually avoided by terminating circuit traces prior to their reaching the streets 15.

In accordance with a preferred embodiment of the invention, each die 13 has test circuitry (to be discussed later) thereon. This allows a matrix of conductive traces 21, 22 to extend across the wafer 11 in order to perform functional tests and to exercise the circuitry on each die 13 prior to the die 13 being singulated by being cut from the remainder of the wafer 11 at the streets 15.

In order to accomplish this, the matrix of circuit traces 21, 22 must be connectable to the test circuitry on each die 13 and the matrix of conductive traces 21, 22 must be removed prior to wafer cut.

In accordance with the preferred embodiment, the test circuitry on each die 13 included a nonvolatile memory portion on which tests results on wafer level testing may be recorded. Thus, while all of the die 13 on the wafer 11 are tested simultaneously, it is possible to use probe techniques to separately read the test results on each individual die 13. Since the test circuitry is on the die 13, it is also possible to accomplish a more thorough test regimen at wafer level and to simultaneously test all the die 13 on a wafer 11. Significantly, the ability to simultaneously test all of the die 13 on a wafer 11 will also provide an opportunity to simultaneously test all the die on multiple wafers, including environmental testing, at least of the unpackaged die 13.

In order to permit singulation of the die 13 by use of a wafer saw, it is necessary to remove the conductive traces 21, 22, at least to sever the traces where the traces 21, 22 cross the streets 15 between adjacent die 13. In the preferred embodiment this is accomplished by removing the entire layer of the traces 21, 22, known as a "metal mask layer." This can be accomplished by use of mechanical planarization techniques, such as chemical-mechanical planarization (CMP) or other processes which etch or remove metal.

The CMP process uses a large abrasive disk upon which the wafer 11 is engaged, thereby abrading material from the top surface of the wafer 11. In the case of the conductive traces 21, 22, these are deposited over a passivation layer, and so removal by CMP abrasive techniques which merely accomplish a planarization of the passivation layer. At points in which the conductive traces 21, 22 contact circuitry on the die 13, the material from the matrix of conductive traces 21, 22 would very likely not be completed abraded. This should not cause a problem, since those locations would remain level with the passivation layer and would not hinder package. The conductive locations may still be used for probe activity, thereby enabling one to perform further testing of the die subsequent to the removal of the conductive layer.

Figure 2:
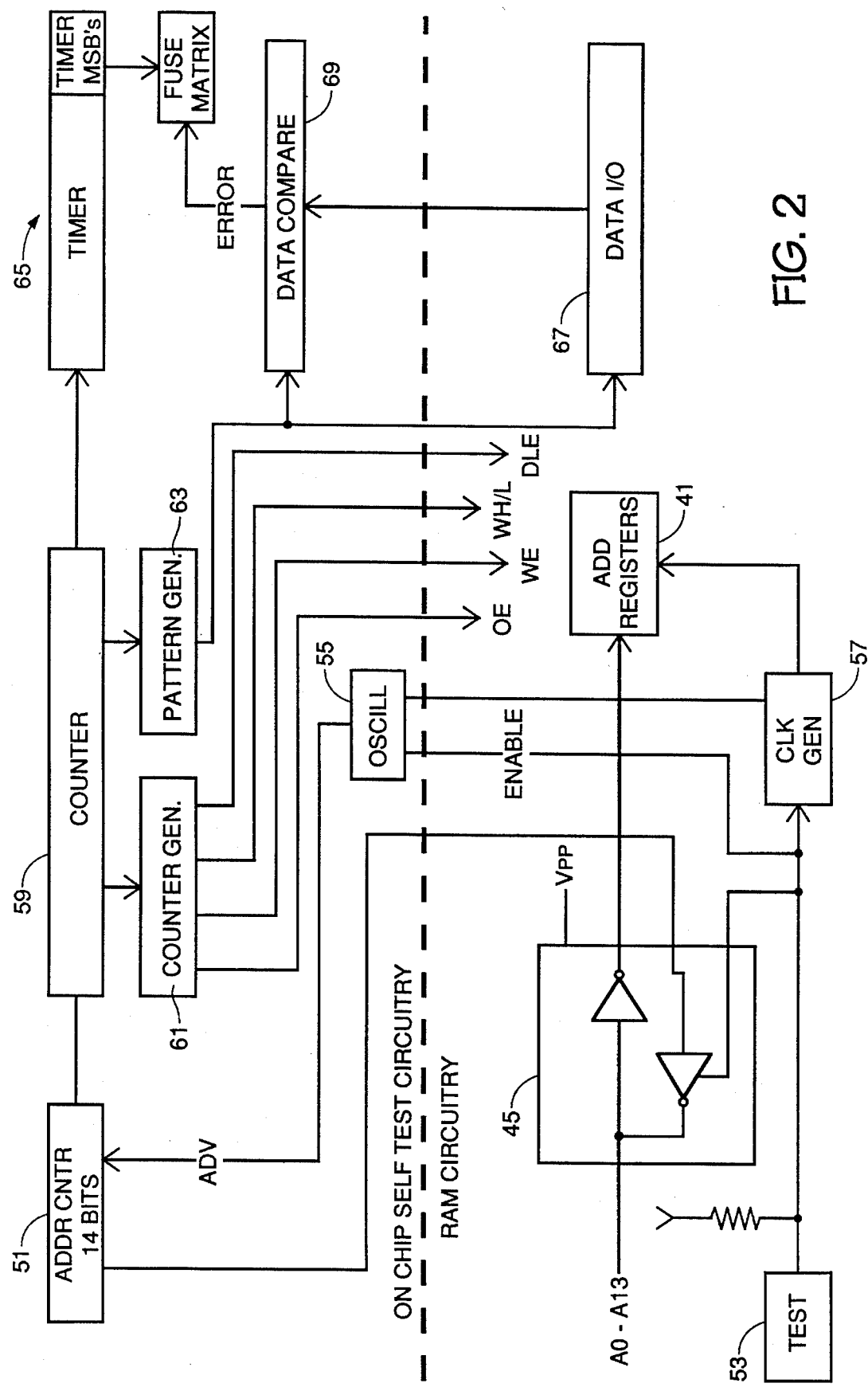
FIG. 2 is a schematic block diagram showing the use of an on-chip self test circuit in accordance with the present invention.

FIG. 2 shows a block diagram of the test circuitry with associated RAM circuitry. The figure shows a configuration for an on-chip test circuit for use with a semiconductor array circuit. Example of semiconductor array circuits are Static Random Access Memories (SRAMs), Dynamic Random Access Memories (DRAMs), as well as logic arrays and other circuits which include a repeat pattern of logic circuit elements (not separately shown) are normally addressed through address registers 41 which controls the addressing of logic circuitry (not shown) on the die 13. Address data is supplied through in/out ports 43 which, in the case of SRAMs, may include separate ports for data in and data out. The data transmitted through the data in/out port 43 is written to or read from addresses designated by the address register 41.

An address register buffer 45 is used to transmit address commands to the address registers 41 in accordance with an address protocol, as defined under JEDEC Standards. In order to test the circuit array on the die 13, the address buffer 45 has a test mode, wherein a test enable signal controls an amplifier which transmits a pattern received from an address counter 51. A pad 53 for indicating the test mode is required. The test enable signal is provided through the test pad 53 and is used to enable the address buffer 45, as well as controlling an oscillator 55 and a clock generator 57. The address counter 51 provides a signal to a counter 59. The counter, in turn, controls a control generator 61 and controls a pattern generator 63.

The pattern generator 63 provides a signal to a timer 65 and simultaneously to data in/out circuit 67. A data compare circuit 69 compares data in with data out and generates an error signal to indicate a failure mode. The timer 65 then provides a timer signal, which, when the timer signal coincides with the error signal "burns in" an indication of such failure at a PROM 71.

Figure 3:
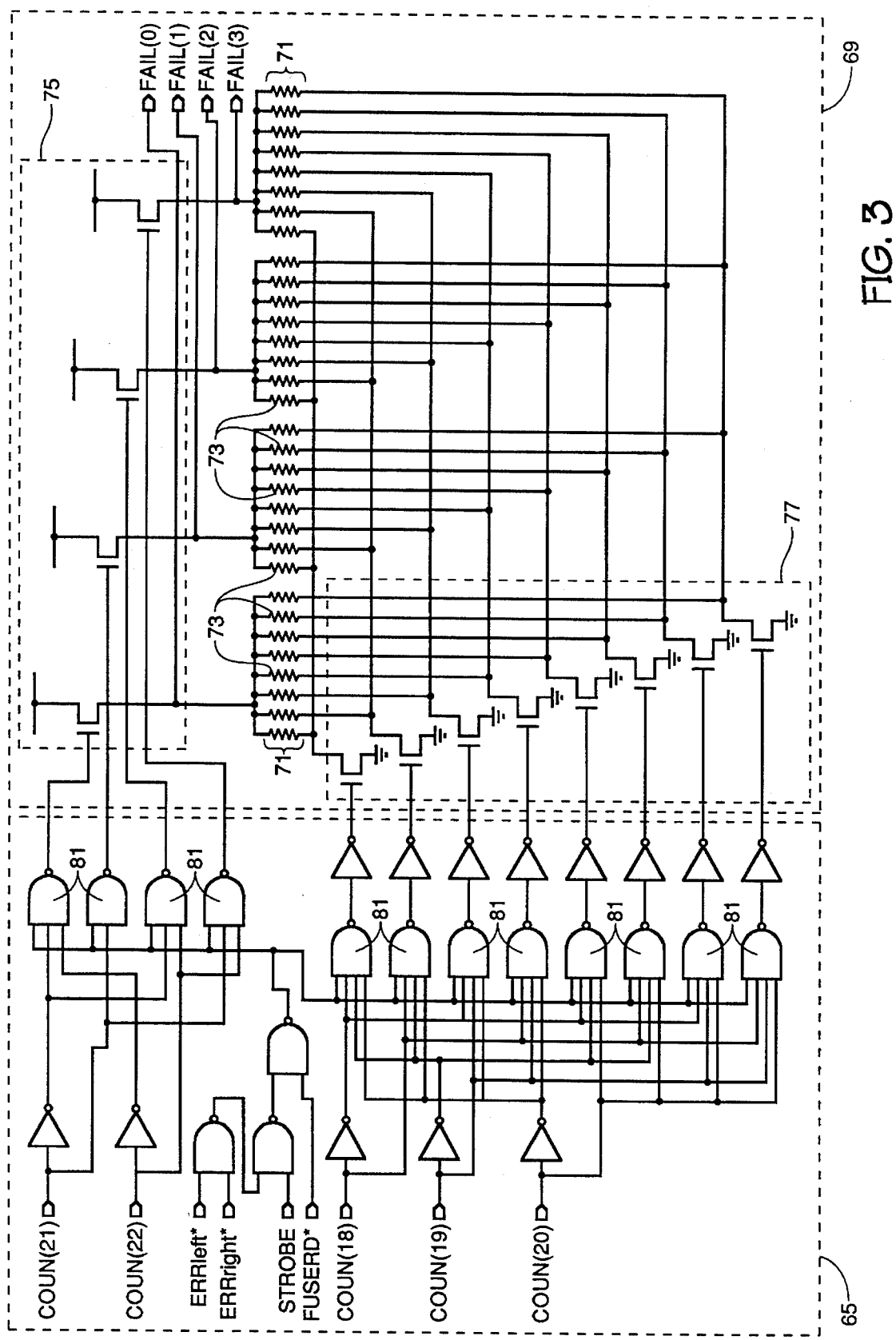
FIG. 3 shows a nonvolatile register circuit, using a matrix of fuses, which is used to provide an indication of time and occurrence of failure modes.

Referring to FIG. 3, the PROM section 69 consists of a matrixed array of addressable fuse elements 73. In order to sequence these elements to determine time of failure, current to the elements 73 is selectively gated in response to signals from the timer 65, which gates a matrix of transistors 75, 77. In the embodiment shown, the fuse elements 73 are shown as resistive fuses, although other types of fuse elements may be used, provided that the current supply to the die 13 is sufficient to cause the fuse elements 73 to change conductive states upon detection of an error signal.

Likewise, it is also possible to use antifuse elements, whereby an error signal will cause the antifuse element to "short" and thereby be conductive. Typically these antifuse elements take the form of diodes 83, shown in FIG. 4. In any case, the antifuse element 83 changes its conductive state upon the coincidence of an error signal with count signals which direct a clock count to a particular antifuse element 83.

Accordingly, each fuse or antifuse element 73, 83 represents one bit, and bits correspond to a timing of error signals. The fuse or antifuse elements 73, 83 therefore represent nonvolatile register elements.

Figure 4:
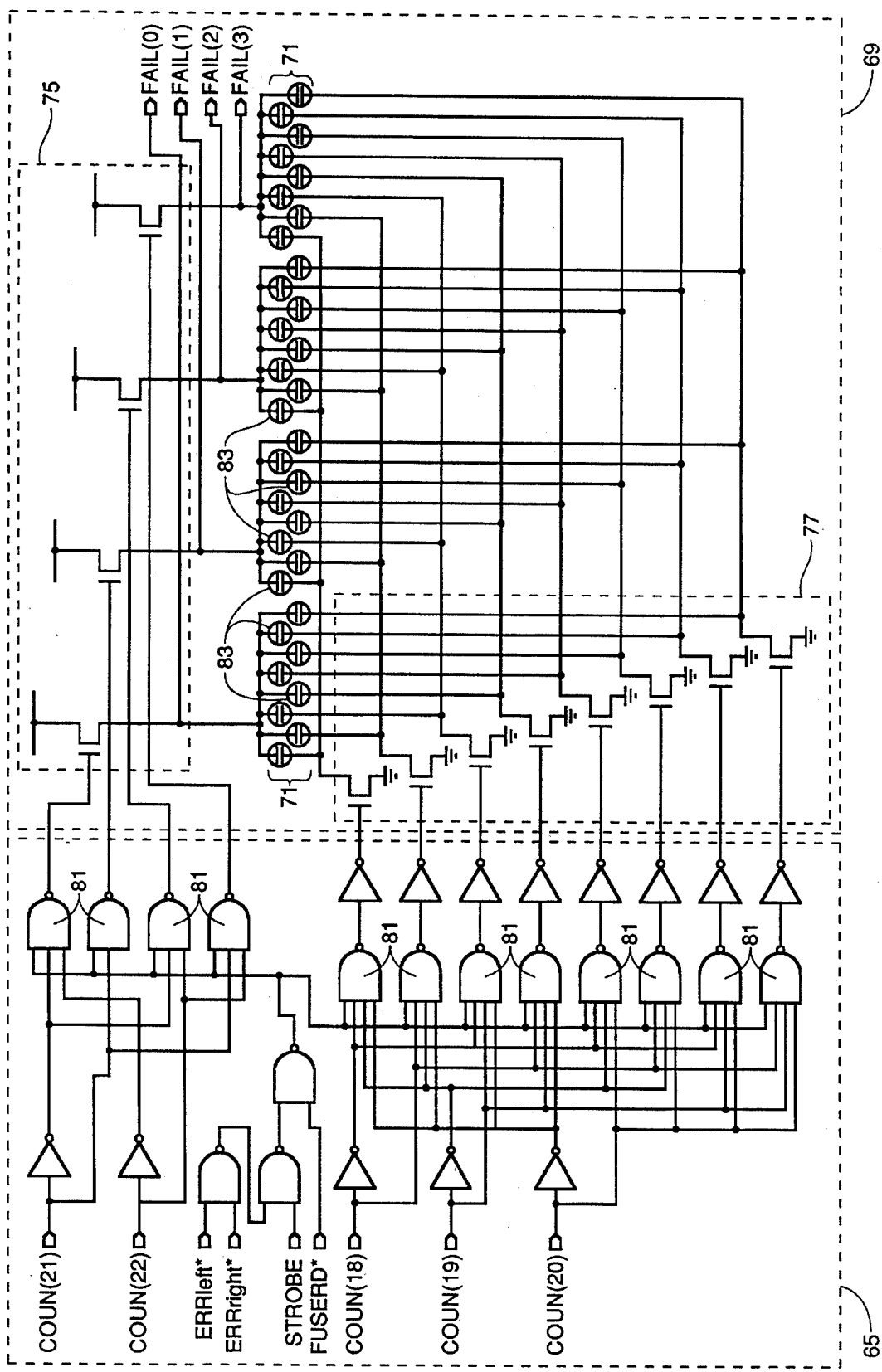
FIG. 4 shows a nonvolatile register circuit, using an array of antifuse elements, which is used to provide an indication of time and occurrence of failure modes.
Figure 5:
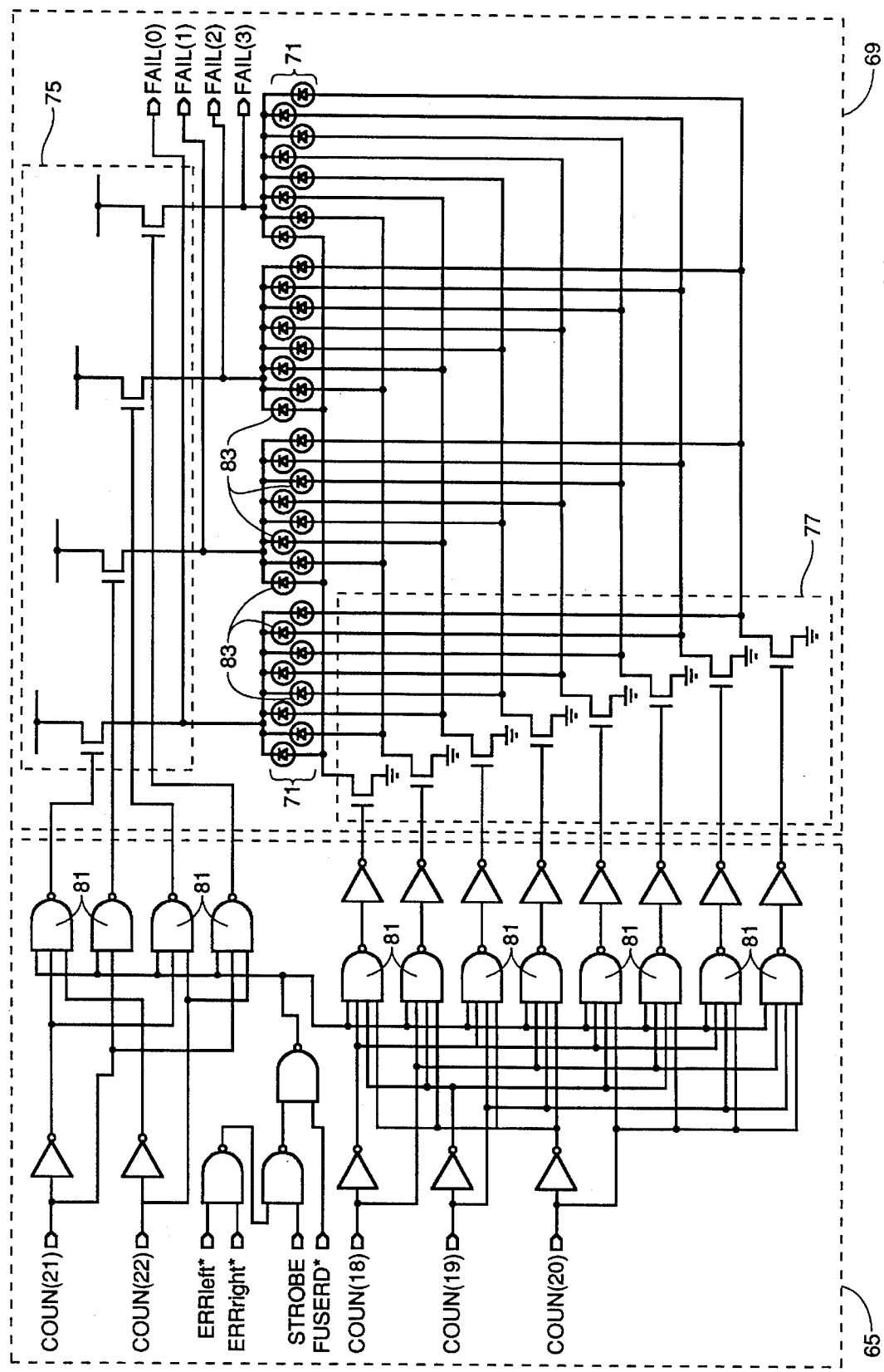
FIG. 5 shows the use of a second address circuit with a nonvolatile register array, used to provide an indication of time and occurrence of failure modes.

FIG. 5 shows the use a second address circuit 101 connected to nonvolatile register elements 103, which may be fuse or antifuse elements, such as the fuse or antifuse elements 73, 83 shown in FIGS. 3 and 4. The second address circuit 101 makes it possible to overcome a requirement for high potentials and currents for writing to the nonvolatile register elements 103 of the built in test circuit. By designing the nonvolatile register elements 103 to be written at normal operating potentials, the nonvolatile register elements 103 would be more readily written to. The second address circuit would be current limited, so as not to change the logic states of the nonvolatile registers and thereby permitting the nonvolatile registers to be read without inadvertently writing to the nonvolatile register elements 103.

Such a technique of using a separate address circuit is particularly adaptable to antifuse elements 83, since an antifuse element 83 can easily be written to by providing sufficient current, and by limiting current, the antifuse elements 83 can be prevented from being written to.

It is also possible to provide a current limiter in a read/write address circuit, such as shown in FIGS. 3 and 4. This would also have the effect of positively limiting current to the nonvolatile memory during read operations.

Figure 6:
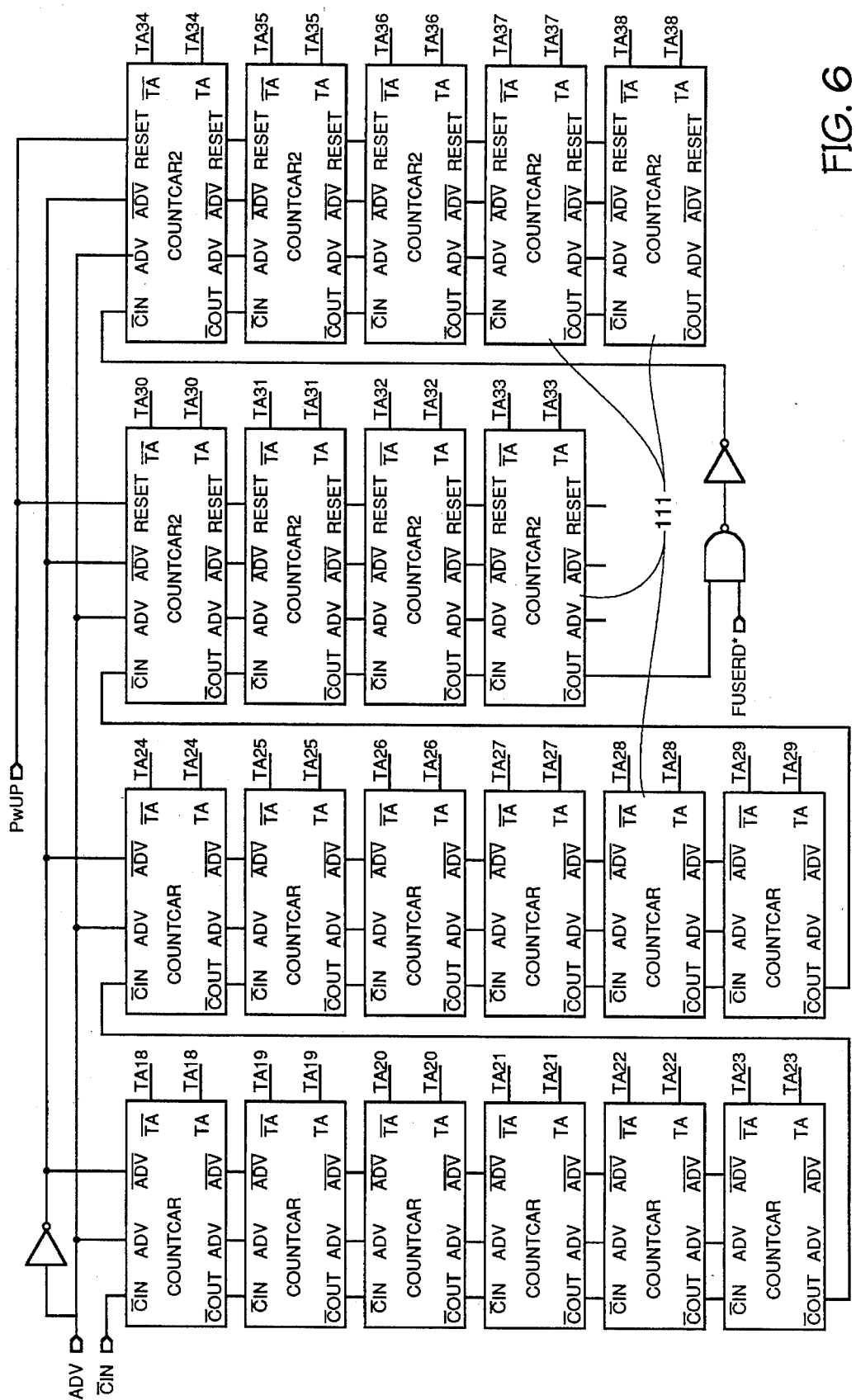
FIG. 6 shows a timer circuit used in the circuit of FIG. 2, in which a plurality of counters provides a timer output.
Figure 7:
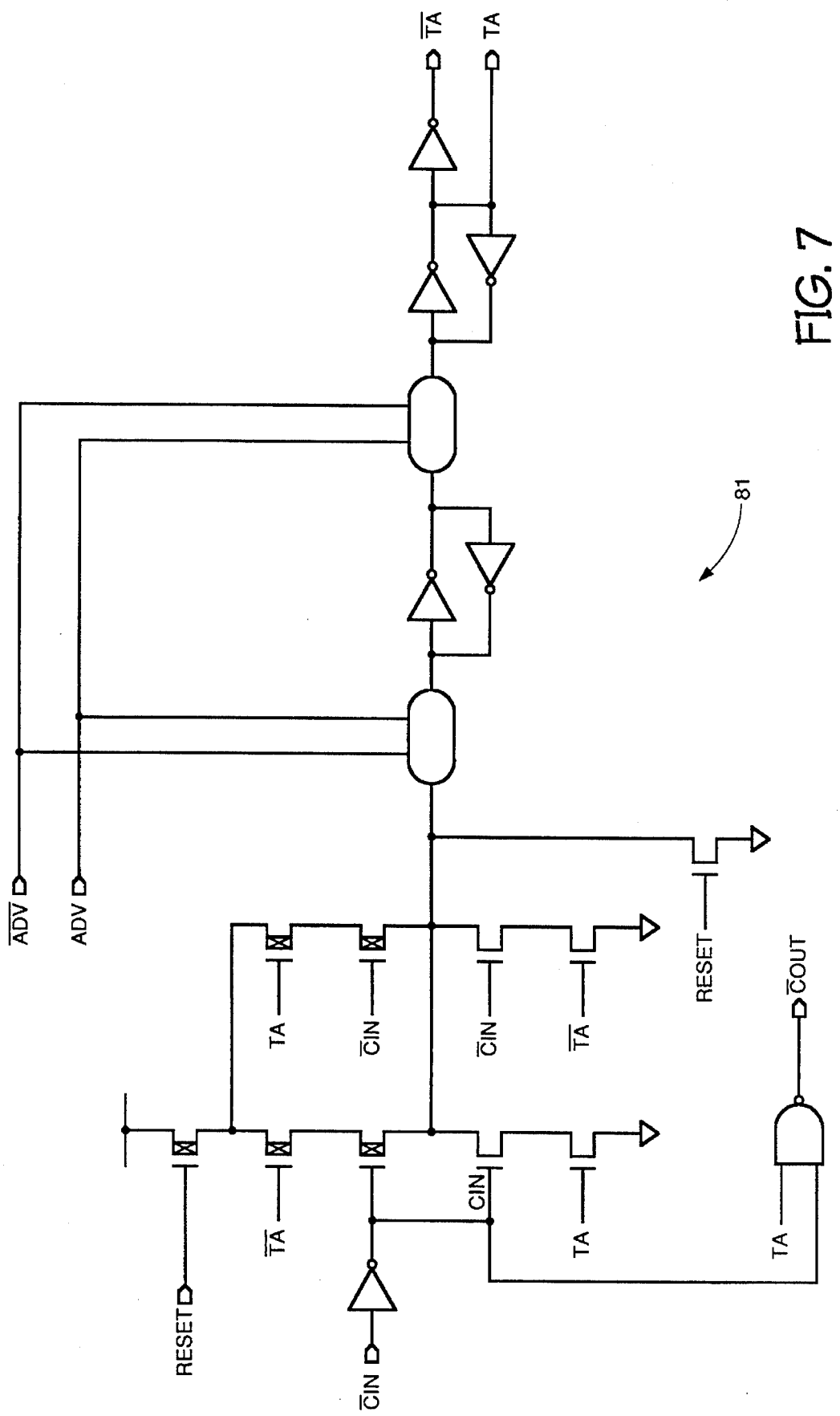
FIG. 7 shows the configuration of the gates used in the timer circuit of FIG. 6.

FIG. 6 shows a timer circuit 65 used to provide timed outputs to the PROM section 69 (FIG. 3). The timer 65 consists of a plurality of gates 111, which are used to sequence the gating devices 75, 77 of the fuse matrix 69. These gates 111 receive signals from which correspond to signals from the address generator 51 in order to provide the appropriate timing sequence, once an enable signal is provided through the test pad 53. FIG. 7 shows the configuration of the gates 81.

Figure 8:
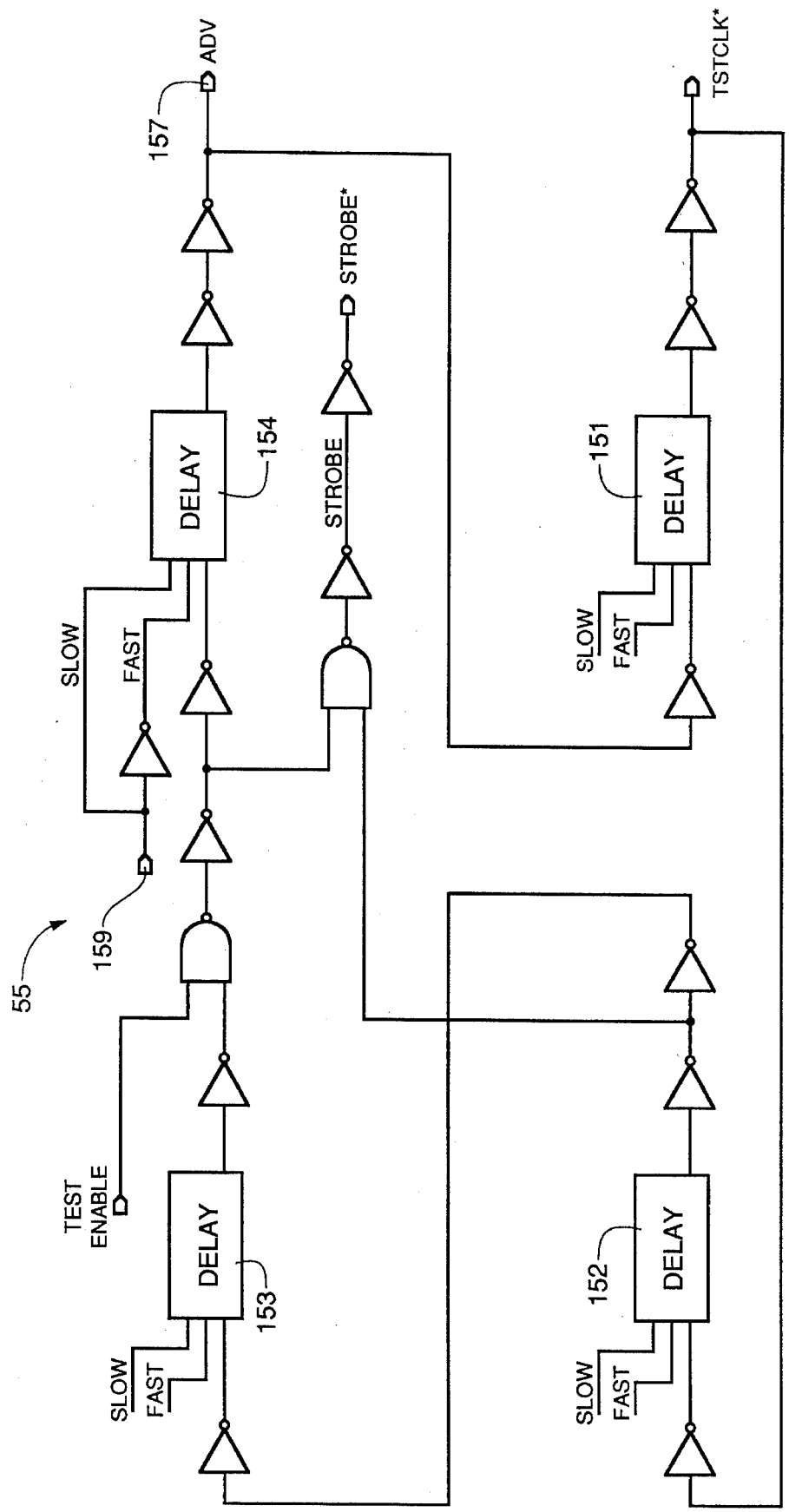
FIG. 8 shows details of an oscillator circuit used in the self test circuit of FIG. 2.

FIG. 8 shows an oscillator circuit 55 used to provide a variable speed output for testing circuitry on the die 13 at different speeds. A plurality of adjustable delays 151–154 are used to generate a series of output timing signals, at an "advance" node 157. A "slow" mode is established by providing a "slow" enable signal, at a "slow mode" node 159. While "slow mode" node 159 is shown providing inputs to delay 154, similar nodes (not shown) would be applied to adjustable delays 151–153, thereby providing a capability of substantial adjustment in clock speeds.

Figure 9:
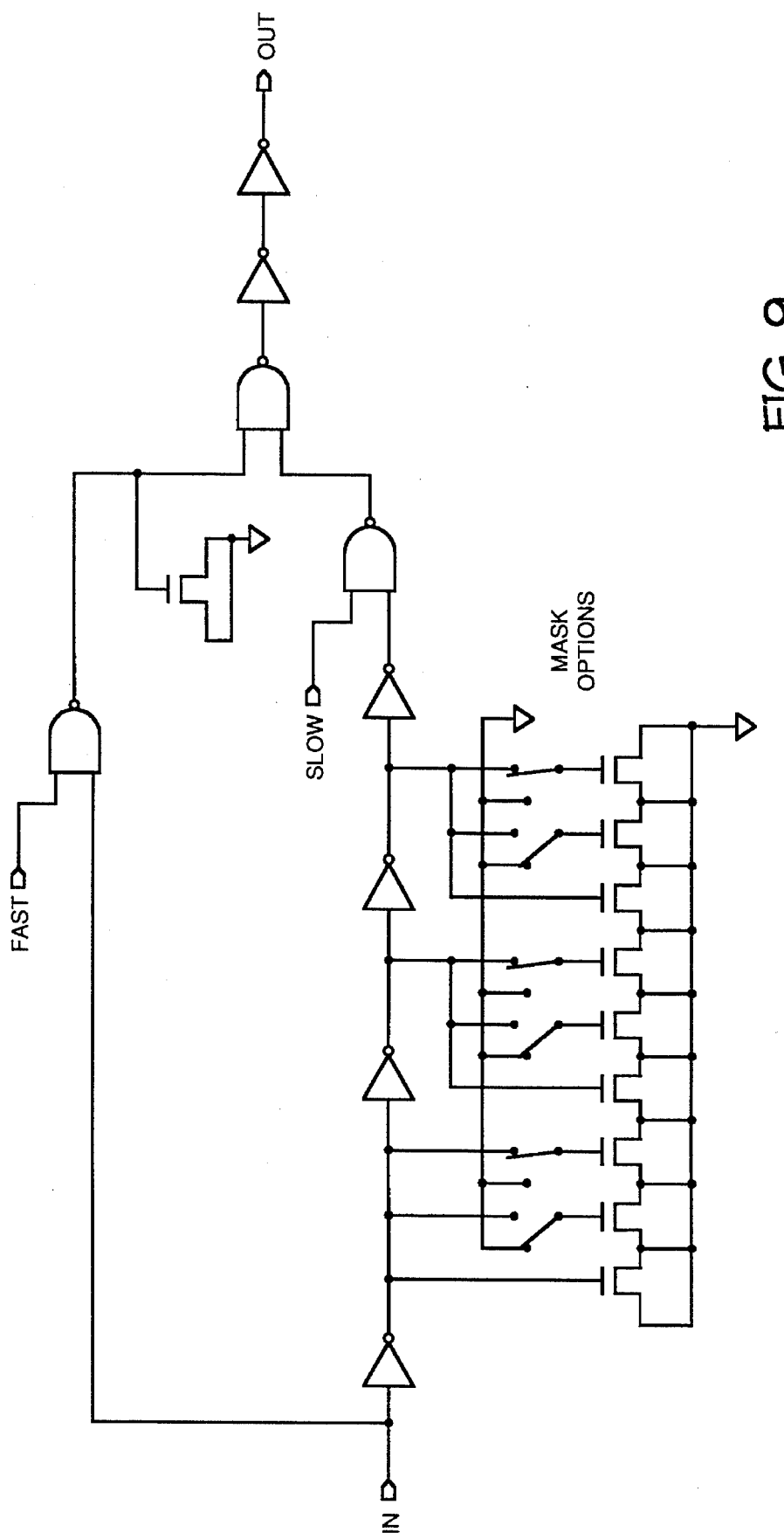
FIG. 9 shows a clock generator circuit used in the self test circuit of FIG. 2.

A clock generator circuit 57 is shown in FIG. 9, whereby a series of mask options are able to further adjust speed. The "slow mode" node 159 of FIG. 8 is able to be connected through a top mask layer, which is removed subsequent to burnin testing of the die 13, whereas the mask options are generally enabled as a part of a design of the part prior to fabrication of the part. While a particular configuration of mask options and slow nodes is shown, it is anticipated that the particular arrangement of speed control methods will vary on different part designs: The "slow node" 159, when grounded, inactivates the slow mode.

Figure 10:
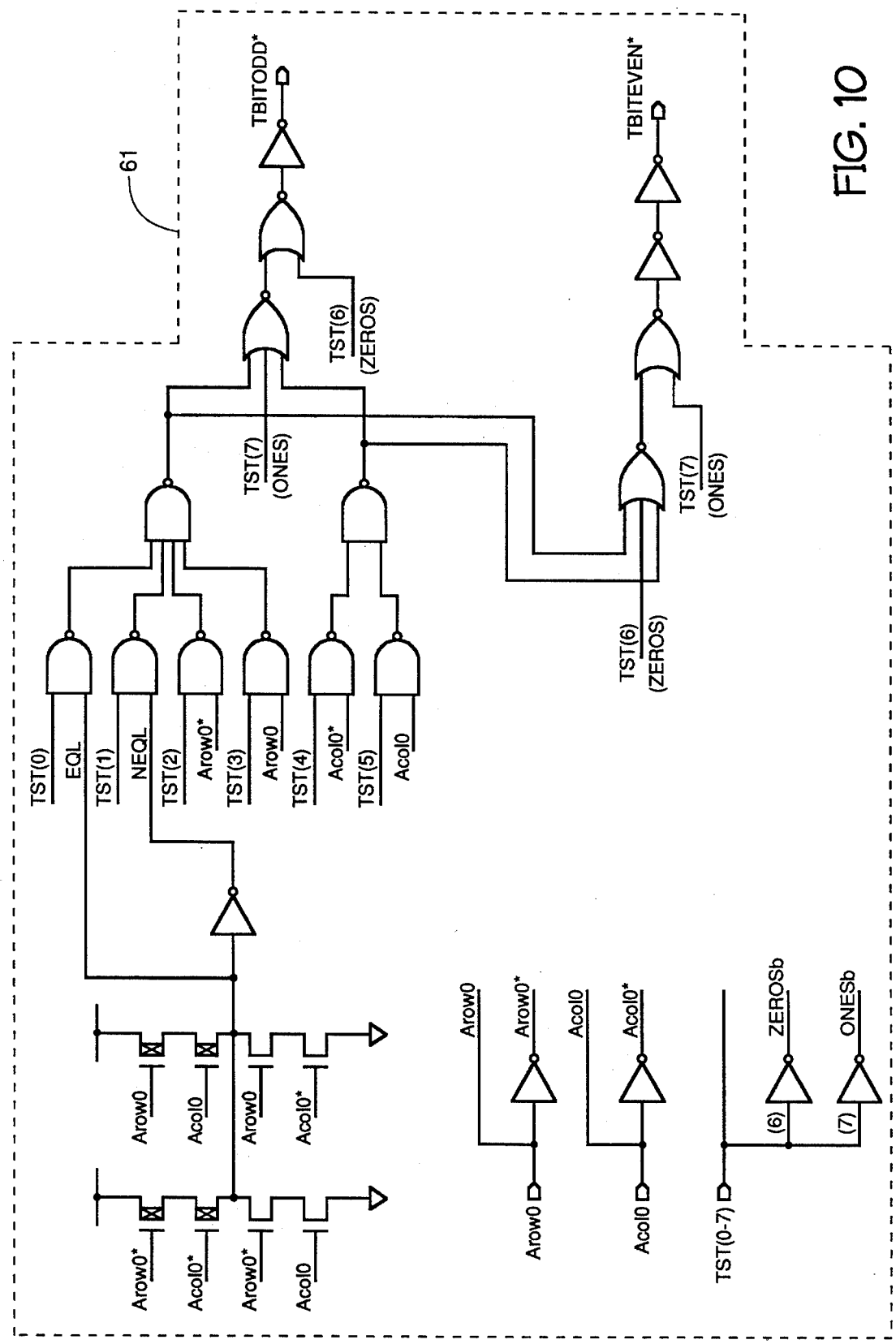
FIG. 10 shows a pattern generator circuit used in the self test circuit of FIG. 2.

FIG. 10 shows a typical pattern generator 61. The purpose of the pattern generator 63 is to provide sequences of Data for writing and comparing "read" data for normal operators, so that an entire array of logic circuits (SRAM cells) may be tested.

Figure 11:
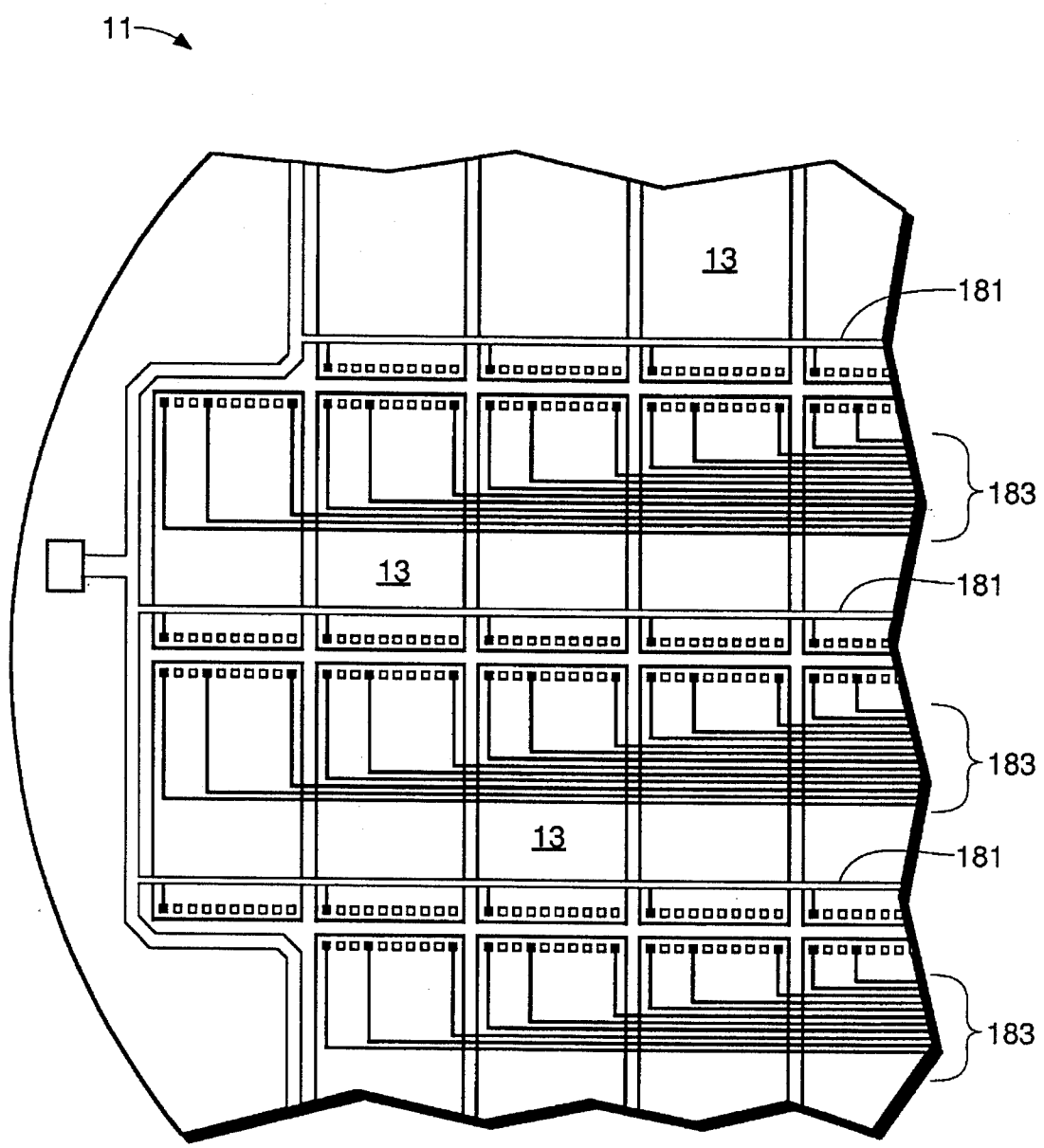
FIG. 11 shows use of a metal mask to provide several conductive lines to each die in order to interconnect test pins on a semiconductor wafer.

It is also possible to provide several conductive lines to each die 13, as shown in FIG. 11. If this is done, the additional lines may be caused to overlap in a multiple layer arrangement (not separately shown) or each row of dies will have a separate set of conductive lines. Separate conductive lines would permit the test results from the individual dies to be separately read from a location remote from the dies 13, and most likely remote from the wafer 11. Preferably, in such an arrangement, each die 13 would have at least one unique connection, typically at least one conductive line which connects with that die. That one conductive line would establish a unique address for the die in order that die functions may be separately performed. A significant die function which would be performed separately is the transmission of data. The separate transmission of data may be accomplished by separately enabling the data or by having separate data outputs, or any other technique which will result in the data output being discrete.

OPERATION

The oscillator 55 divides the initial operational timing for both the address registers 41 and the address counter 51. The oscillator 55 receives a test enable signal from the test pad 53 in order to cause the oscillator 55 to become operational. A second operational state is accomplished by the enablement of fast and slow modes of oscillator operation.

"Slow mode" (node 59 of FIG. 8) automatically comes up for burnin. The fast mode can be made by grounding the slow node during further testing.

It is anticipated that the ordinary burnin functions of the die 13 while in wafer form would be accomplished at a slow speed. This is both because the requirement that functional die circuitry be allowed to exercise and that this be accomplished at the varying temperatures which are typical of burnin operation. Once the matrix of conductive traces 21, 22 has been removed from the wafer 11, it is then possible to perform parametric tests on the individual die 13. At that time, the oscillator is enabled to operate at a higher rate, so that tests can be performed at a higher speed.

This accomplishes two things. The first is the ability to provide a much more tightly controlled test environment, as the circuitry on the die 13 is exercised at higher speed. Secondly, during testing of the die circuitry on an individual bases, it is important that the test speed be increased, particularly as a large number of circuit elements much be tested. This can be appreciated when it is considered that, when the entire wafer 11 is tested in parallel, over 100 die, and sometimes upwards of 1000 die, are tested simultaneously. A reduction of test speed under such circumstances is not especially significant. In the case of burnin testing, speed of testing is less important than the opportunity to exercise the part. In the usual case, the cycle time at which tests can be completed is not even a factor because a minimum time of operation of the parts under the burnin environmental conditions is specified.

The clock generator 57 receives the oscillator signal and further causes the address lines to be registered. The oscillator 55 controls the speed at which the addresses are sequenced. This is accomplished by a gating arrangement, whereby a pair of gates 91, 92 are switched in order to provide different delay times for address pulses. In addition, a plurality of mask options enable the further adjustment of a time delay by selectively bypassing amplifier stages.

In the preferred embodiment, the fast enabling signal is provided during test sequences by applying the fast enabling signal at probe.

In an alternate embodiment, the provision of the fast and slow enabling signals is accomplished by the use of a current divider whereby the matrix of conductive traces 21, 22 pulls the fast and slow pins to the appropriate states for slow operation. After the matrix of conductive traces 21, 22 is stripped, the fast and slow enable signals may be provided by providing a separate probe pad. In that embodiment, the clock generator 57 runs fast with the matrix of conductive traces 21, 22 stripped unless the slow enable signal is applied. This is accomplished by the use of a resistive circuit, whereby, with no enable signal applied, the clock generator 57 is allowed to float to a state wherein the fast mode of operation is enabled. The clock generator 57 generates a two phase output which is used to provide a timed signal to the address registers 41.

The clock generator 57 provides its signal to the address registers 41, which provide addressing information to address the circuitry on the die 13 during the test operation period. The pattern generator 63 generates odd and even inputs such that a pattern is written in to RAM. An output of the RAM is then read out and the output is compared with the pattern which is again generated by the pattern generator 63. The series of patterns are typically checker board, inverted checker board, row stripe, inverted row stripe, column stripe, inverted column stripe, all 0's and all 1's. This sequence is calculated to determine whether the array is responding in an appropriate manner or if the array has a fault. The pattern generator 63 provides its signal to the data in/out circuit 43 in accordance with the patterns described.

The following describes a method of doing self test which allows the RAM chip to test itself. This is particularly helpful when a self test is required during burnin testing. This particular test methodology requires only two connections to the die: ($V_{cc}$, and ground). If the substrate voltage is to be forced, then a connection to the substrate could also be made.

Referring again to FIG. 2, when a potential is applied to the test pad 53, the circuitry on the die 13 enters a test mode. In the preferred embodiment, the potential applied to the test pad 53 is a grounding potential, although the use of an operating potential of the circuit (usually either 3 or 5 volts) would be equally acceptable. When the pin left unconnected, the device is not in test mode.

When the pin 53 is grounded, the device will start the self test sequence. Self test circuitry for random access memory must provide circuits on board to sequence through the address lines. An address counter that generates a binary count to the address pins is required. A driver at each input pin must tri-state itself when the part is not in test mode. When the RAM is in the test mode, the tri-state driver will drive each pin (address lines, control inputs, and data inputs) when in the WRITE cycle. The address counter is incremented by an on board oscillator. The oscillator frequency determines the test cycle time. For a synchronous SRAM the oscillator period is divided into four equal parts, as shown in the oscillator circuit of FIG. 8. The first edge out is the square wave advance signal that causes the counter to count. This positive edge will cause the address to be registered, and the RAM to execute a cycle. The negative edges of Advance and then the clock (CLK) are then generated. FIG. 12 shows the 1 bit of logic for the counter. The carry in (CIN) is feed from the lower stage carry out (COUT).

Each time the counter cycles clear through all the address count, the WE(Read/Write) control is changed: (WRITE the complete Ram then READ the complete RAM). Other controls (OE, BWL, BWH, and DLE) associated with a READ or WRITE operation are also controlled off this bit of the counter. This control is just the next count in the counter. The next three bits in the counter are used to determine which pattern will be generated for writing and comparing the output. (Test patterns such as checkerboard, checkerboard bar, row strip, row strip inverted, column strip, column strip inverted, all 1's, all zero's, diagonal, and diagonal bar) are generated.

Since the self test circuitry is used for burnin, it must do several functions necessary for the burnin tests. It is important for burnin to know when the burnin failures happen. In order to make sure that all the burnin failures have occurred during the burnin time, a recording of the time for the failure is necessary. Most, if not all, of the failures should occur during the first quarter and at least by the first half of the burnin time. If the failures happen in the first part of the burnin, there is a strong indication that all the infant mortality failures have occurred and the burnin time is adequate.

The counter is extended in order to have a real time timer available on chip. The last few (2 up to 5) most significant bits of the counter will indicate which portion of the total burnin time the failure occurred. When a failure occurs, a fuse will be blown corresponding to the most significant bit of the timer. Normal burnin times are of the order of 12 to 48 hours. If the last 5 bits are used, and the timer counts for approximately 100 hours, each count of the last 5 most significant bits will represent 3 hours of burnin time. See FIG. 4 for a description of the counters and input circuitry.

As shown in FIGS. 3–5, if a error occurs during the burnin test, the counter is keeping track of the time. The last five bits of the timer is shown as count <18:23>. For a 96 hour timer (assuming a 600 ns cycle time) each bit represents 3 hours. The corresponding time indicator fuse will be blown when ever a error is detected. After the burnin test has been done, the fuses can be read during the final wafer sort before packaging. A fuse is also blown as a test confirmation, in order to indicate that the part has been tested and the high current fuse to each die has not blown.

If the complete wafer 11 is tied to $V_{CC}$ and ground, each device will do it's own self test. If a failure occurs, a fuse corresponding to the time of failure is blown. After the burnin time is complete, a wafer sort will be done. Part of the wafer sort will be a verifying that no fuses were blown. If a fuse was blown, the data will be cataloged, and analyzed to verify the burn-in was of sufficient time.

The integrated circuit device therefore includes a functional circuit and a test circuit. While the test circuit is certainly functional as a test circuit, the purpose of the integrated circuit device is to perform a diverse function, such as RAM storage, so that the test circuit is distinguished from the functional circuit in that sense. Additionally, the test circuit will in the preferred embodiment use some portions of the functional circuit, such as a refresh circuit.

We claim:

1. In an integrated circuit device formed on a semiconductor wafer and having functional circuitry, a test circuit for testing the functional circuitry, said test circuit comprising:

a) an oscillator circuit formed on said integrated circuit device for providing a periodic output;

b) the oscillator circuit including circuitry for varying a period of the periodic output in order to vary a test parameter;

c) circuitry for receiving the periodic output from the oscillator circuit and providing a timing signal to the functional circuitry of the integrated circuit device as a device under test DUT, the timing signal having a period which is proportional to the periodic output, said timing signal controlling test sequences during said testing of the functional circuitry, such that a variation in the test parameter as a result of varying the period of the periodic output permits the response of the functional circuitry of the DUT at different operating speeds to be determined;

d) a scanning circuit for determining outputs of the functional circuitry; and e) a response circuit responsive to the scanning circuitry for providing an error signal during said testing; and f) a nonvolatile memory responsive to the error signal for retaining an indication of test results.

2. The test circuit of claim 1, further comprising:
   the oscillator circuit including a ring oscillator.

3. The test circuit of claim 1, further comprising:
   a) the oscillator circuit including a ring oscillator; and b) the circuitry for varying the period being a frequency divider which receives an oscillator output signal from the ring oscillator and provides a signal which is a fraction of the ring oscillator's output signal, the frequency divider further being adjustable in order to adjust the period of the periodic output.

4. The test circuit of claim 1, further comprising:
a) the DUT being testable while in wafer form prior to separation of the integrated circuit device from other integrated circuit devices on said wafer; and
b) a grid containing a plurality of conductive traces on the wafer, the conductive traces extending from external connection points to each DUT so that power applied to the conductive traces enable testing of the DUTs in said wafer form.

5. The test circuit of claim 1, further comprising:
a) the DUT being testable while in wafer form prior to separation of the integrated circuit device from other integrated circuit devices on said wafer;
b) a grid containing a plurality of conductive traces on the wafer, the conductive traces extending from external connection points to each DUT so that power applied to the conductive traces enable testing of the DUTs in said wafer form;
c) the grid being deposited on the wafer in such a manner that a grid may be removed subsequent to testing, whereupon the integrated circuit devices may be operated in a normal manner with said grid removed, thereby permitting the integrated circuit devices to be operated without enabling the test circuitry; and
d) said removal of the grid being accomplished by removing a metal mask layer from the wafer.

6. The test circuit of claim 4, further comprising:
a) the plurality of conductive traces on the wafer including a power supply grid and a common grid;
b) one of said power supply and common grids further providing a test enable signal to each DUT.

7. The test circuit of claim 4, further comprising:
a) the plurality of conductive traces on the wafer including a power supply grid and a common grid;
b) the plurality of conductive traces on the wafer further including a grid which provides each DUT on the wafer with a unique address.

8. In an integrated circuit device formed on a semiconductor wafer and having a functional circuit array, a test circuit for testing the functional circuit array, said test circuit comprising:
a) a burnin circuit formed on the integrated circuit device, in electrical communication with the functional circuit array and which permits the functional circuit array to be selectively operated in a normal operating mode by which the functional circuit array may be addressed through external connections and a burnin code, and in which the burnin circuit causes the integrated circuit device to cycle through predetermined sequences for addressing at least a substantial portion of the functional circuit array;
b) an oscillator circuit formed on the integrated circuit device in electrical communication with the burnin circuit for providing a periodic output;
c) the oscillator circuit including circuitry for varying the period of the periodic output of the oscillator circuit;
d) circuitry in electrical communication with the oscillator circuit for receiving the periodic output from the oscillator circuit and providing a timing signal to the functional circuit array, the timing signal having a period which is proportional to the periodic output, such that a variation in a test parameter with a variation in the period of the periodic output permits the response of the functional circuit array at different operating speeds to be determined;
e) scanning circuitry for determining outputs of the functional circuit array;
f) a response circuit responsive to the scanning circuitry for providing an error signal; and
g) a nonvolatile memory responsive to said error signal for retaining an indication of test results.

9. The test circuit of claim 8, further comprising:
a) a data comparison circuit, the data comparison circuit comparing the periodic output with data received from the semiconductor circuit device and generating an error signal when the data comparison circuit detects a mismatch between the periodic output with data received from the semiconductor circuit device; and
b) a latch circuit, the latch circuit being responsive to the error signal and the sequential indication signal, thereby providing an indication of sequential event during which the error was detected.

10. The test circuit of claim 8, further comprising:
the oscillator circuit including a ring oscillator.

11. The test circuit of claim 8, further comprising:
a) the oscillator circuit including a ring oscillator; and
b) the circuitry for varying the period being a frequency divider which receives an oscillator output signal from the ring oscillator and provides a signal which is a fraction of the ring oscillator's output signal, the frequency divider further being adjustable in order to adjust the period of the periodic output.

12. The test circuit of claim 8, further comprising:
a) the oscillator circuit including a ring oscillator; and
b) the circuitry for varying the period having at least four frequency adjustment circuits in order to adjust the period of the periodic output.

13. The test circuit of claim 8, further comprising:
a) the functional circuit array being testable while in the form of a wafer which contains a plurality of similar devices, each of said plurality being a functional circuit array; and
b) a grid containing a plurality of conductive traces on the wafer, the conductive traces extending from external connection points to each functional circuit array so that power applied to the conductive traces enable testing of the functional circuit arrays on the wafer.

14. The test circuit of claim 8, further comprising:
a) the functional circuit array being testable while in the form of a wafer which contains a plurality of similar devices, each of said plurality being a functional circuit array;
b) a grid containing a plurality of conductive traces on the wafer, the conductive traces extending from external connection points to each functional circuit array so that power applied to the conductive traces enable testing of the functional circuit arrays on the wafer; and
c) the grid being deposited on the wafer in such a manner that a grid may be removed subsequent to testing, whereupon the integrated circuit devices may be operated in a normal manner with said grid removed, thereby permitting the integrated circuit devices to be operated without enabling the burnin circuitry.

15. The test circuit of claim 14, further comprising:
a) the plurality of conductive traces on the wafer including a power supply grid and a common grid;
b) one of said power supply and common grids further providing a test enable signal to each functional circuit array.

16. The test circuit of claim 14, further comprising:
a) the plurality of conductive traces on the wafer including a power supply grid and a common grid;
b) the plurality of conductive traces on the wafer further including a grid which provides each functional circuit array on the wafer with a unique address.

17. The test circuit of claim 14, further comprising:

said removal of the grid being accomplished by removing a metal mask layer from the wafer.

18. The test circuit of claim 14, further comprising:

said removal of the grid being accomplished by removing a metal mask layer from the wafer by the use of a mechanical planarization process.

* * * * *